(12) United States Patent
Kim et al.

(10) Patent No.: US 10,607,943 B2
(45) Date of Patent: Mar. 31, 2020

(54) DISPLAY DEVICE

(71) Applicant: SAMSUNG DISPLAY CO., LTD., Yongin-si, Gyeonggi-do (KR)

(72) Inventors: Young Kwan Kim, Yongin-si (KR); Jae Young Kim, Yongin-si (KR); Yeon Tae Kim, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/197,781

(22) Filed: Nov. 21, 2018

(65) Prior Publication Data

US 2019/0172790 A1   Jun. 6, 2019

(30) Foreign Application Priority Data

Dec. 5, 2017 (KR) .................. 10-2017-0166079

(51) Int. Cl.
   *H01L 23/544*   (2006.01)
   *G06F 3/044*    (2006.01)
   (Continued)

(52) U.S. Cl.
   CPC ............ *H01L 23/544* (2013.01); *G06F 3/044* (2013.01); *G06F 3/0412* (2013.01);
   (Continued)

(58) Field of Classification Search
   CPC ..... H01L 21/68; H01L 21/682; H01L 21/683; H01L 51/0012; H01L 2021/60075; H01L 23/544; H01L 2223/54426; H01L 2224/0213; H01L 2224/0217; H01L 2224/0224; H01L 2224/10135; H01L 2224/10165; H01L 2224/26135; H01L 2224/40993; H01L 2224/40998;
   (Continued)

(56) References Cited

U.S. PATENT DOCUMENTS

| 5,949,502 A | * | 9/1999 | Matsunaga ....... G02F 1/136204 |
| | | | 349/40 |
| 6,411,359 B1 | * | 6/2002 | Kobayashi .......... G02F 1/13452 |
| | | | 349/149 |

(Continued)

FOREIGN PATENT DOCUMENTS

| KR | 10-0608888 B1 | 8/2006 |
| KR | 10-1027568 B1 | 4/2011 |

(Continued)

*Primary Examiner* — Nitin Patel
*Assistant Examiner* — Amen Woldesenbet Bogale
(74) *Attorney, Agent, or Firm* — Kile Park Reed & Houtteman PLLC

(57) ABSTRACT

A display device includes a window combined with a substrate. The substrate includes a display region with pixels and a non-display region with power lines for the pixels. The window includes a display part corresponding to the display region and a non-display part corresponding to the non-display region. A plurality of alignment marks are on the substrate at a location corresponding to the non-display region. The alignment marks are integrally provided with an outermost power line at an outermost side of the non-display region, and each of the alignment marks overlaps with the non-display part of the window.

18 Claims, 16 Drawing Sheets

(51) Int. Cl.
  *H01L 27/32* (2006.01)
  *G06F 3/041* (2006.01)
(52) U.S. Cl.
  CPC ........ *H01L 27/323* (2013.01); *H01L 27/3276* (2013.01); *G06F 3/0443* (2019.05); *G06F 3/0446* (2019.05); *H01L 2223/54426* (2013.01)
(58) Field of Classification Search
  CPC . H01L 2224/48993; H01L 2224/48998; H01L 27/3276; H01L 27/3223; H01L 27/3279; G02F 2001/133354; G02F 2001/133322; G02F 1/136286; G02F 1/13458; G02F 1/13452; G02F 1/1337; H05K 2203/166; H05K 2203/167; H05K 2201/10128; H05K 1/111; H05K 1/0269
  See application file for complete search history.

(56) References Cited

U.S. PATENT DOCUMENTS

| | | | | |
|---|---|---|---|---|
| 7,808,608 B2 * | 10/2010 | Park | ...................... | G02F 1/1333 349/110 |
| 7,821,638 B2 | 10/2010 | Kim | | |
| 9,047,671 B2 | 6/2015 | Maeda | | |
| 9,082,774 B1 * | 7/2015 | Shin | ...................... | H01L 27/156 |
| 9,419,028 B1 | 8/2016 | Moon et al. | | |
| 2007/0284763 A1 * | 12/2007 | Kim | ................... | H01L 23/4985 257/797 |
| 2008/0030666 A1 * | 2/2008 | Abe | .................... | G02F 1/13452 349/150 |
| 2010/0245271 A1 | 9/2010 | Park | | |
| 2010/0271572 A1 * | 10/2010 | Yokogawa | ............ | G02F 1/1333 349/96 |
| 2012/0319980 A1 * | 12/2012 | Nagaoka | ............... | H05K 1/0269 345/173 |
| 2013/0069212 A1 * | 3/2013 | Araya | ............... | H01L 23/49838 257/666 |
| 2013/0093658 A1 * | 4/2013 | Park | .................... | G02F 1/13452 345/92 |
| 2013/0175154 A1 * | 7/2013 | Takahashi | ............... | G06F 3/044 200/600 |
| 2015/0029680 A1 * | 1/2015 | Saito | .................... | H05K 1/0269 361/748 |
| 2015/0179586 A1 * | 6/2015 | Youk | ................... | H01L 51/5284 428/195.1 |
| 2016/0098111 A1 * | 4/2016 | Tsukamoto | ............. | G06F 3/044 345/173 |
| 2016/0139191 A1 * | 5/2016 | Yashiro | .................. | G01R 31/02 324/750.16 |
| 2016/0370892 A1 * | 12/2016 | Chang | ................... | G06F 3/0416 |

FOREIGN PATENT DOCUMENTS

| | | |
|---|---|---|
| KR | 10-1097306 B1 | 12/2011 |
| KR | 10-1330706 B1 | 11/2013 |
| KR | 10-2014-0120845 A | 10/2014 |
| KR | 10-2016-0092132 A | 8/2016 |

* cited by examiner

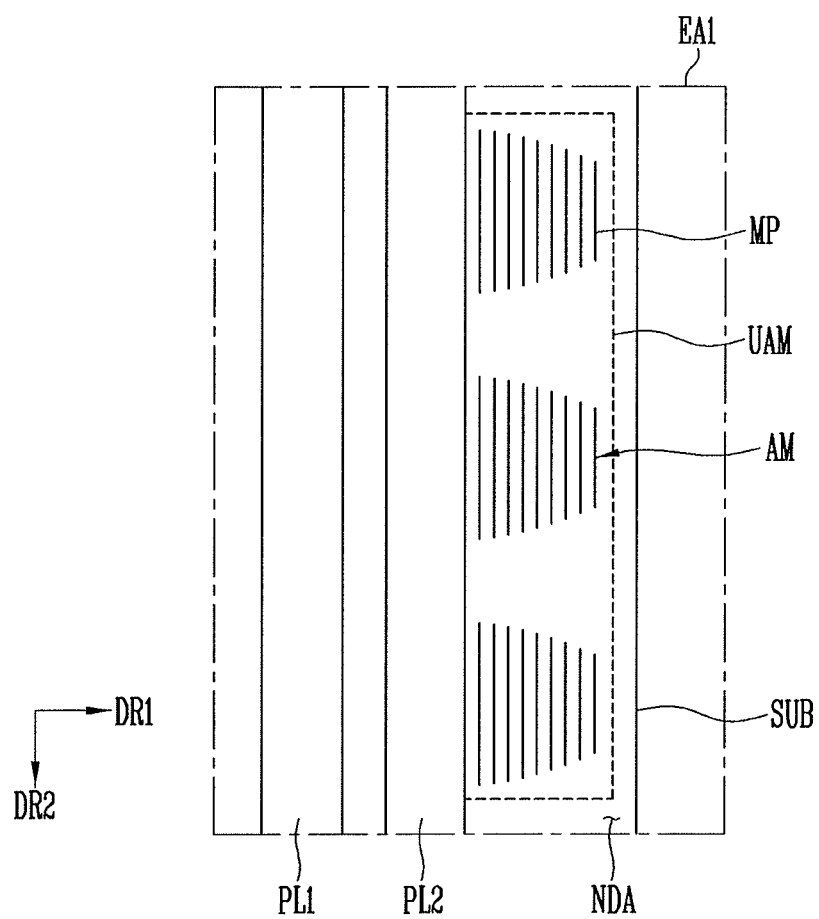

DISPLAY DEVICE

CROSS-REFERENCE TO RELATED APPLICATION

Korean Patent Application No. 10-2017-0166079, filed on Dec. 5, 2017, and entitled, "Display Device," is incorporated by reference herein in its entirety.

BACKGROUND

1. Field

One or more embodiments described herein relate to a display device.

2. Description of the Related Art

A display device may include a protective window combined with a display panel. The display panel may include an alignment mark, in a non-display region, to allow for position recognition when the window is combined with the display panel. The non-display region may include a dead space due to constraint conditions in design of the alignment mark. The dead space introduces inefficiencies and increases the size of the bezel area.

SUMMARY

In accordance with one or more embodiments, a display device includes a substrate including a display region and a non-display region; a plurality of pixels in the display region, each of the plurality of pixels including at least one transistor and a light emitting element connected to the transistor; a plurality of power lines, in the non-display region of the substrate, to apply a power source voltage to each of the pixels; a window including a display part corresponding to the display region of the substrate and a non-display part corresponding to the non-display region of the substrate, the window being combined with the substrate; and a plurality of alignment marks on the substrate and corresponding to the non-display region, the alignment marks integrally provided with an outermost power line at an outermost side of the non-display region among the power lines, each of the alignment marks overlapping with the non-display part of the window.

The outermost power line and the alignment marks may be in a same layer and include a same material. Each of the alignment marks may include a plurality of metal patterns extending along the extending direction of the outermost power line, and the metal patterns may be at the outside of the outermost power line in the non-display region. Each of the alignment marks may include an opening between the metal patterns, and the opening may be a static electricity blocking region that blocks external static electricity as one or more of the metal patterns are disconnected. The metal patterns may be connected to adjacent metal patterns and have a zigzag form when viewed on a plane. The metal patterns may not be electrically connected to adjacent metal patterns.

The display device may include a unit alignment mark including a grouping at least two of the alignment marks as one bundle. Each alignment mark may be in the non-display region of the substrate to correspond to the non-display part of the window. The alignment marks may be spaced apart from adjacent alignment marks by a certain distance. The power lines may include a first power line to provide a first power source voltage to each pixel; and a second power line may provide a second power source voltage to each pixel, and the second power line may be at the outside of the first power line and is the outermost power line.

In accordance with one or more other embodiments, a display device includes a display panel including a substrate including a display region and a non-display region, and a plurality of pixels in the display region; a touch sensor, on the display panel, to sense a touch of a user; and a window on the touch sensor, wherein the touch sensor includes: a base layer including a sensing region to sense the touch and a non-sensing region at one side of the sensing region; a plurality of touch electrodes in the sensing region; a plurality of sensing lines in the non-sensing region and electrically connected to the plurality of touch electrodes; and a plurality of alignment marks on the base layer and corresponding to the non-sensing region, the alignment marks integrally provided with an outermost sensing line at the outermost side of the non-sensing region among the sensing lines. The outermost sensing line and the alignment marks may be in a same layer and may include a same material.

Each of the alignment marks may include a plurality of metal patterns extending along the extending direction of the outermost sensing line, and the metal patterns may be at the outside of the outermost sensing line in the non-sensing region. Each of the alignment marks may include an opening between the metal patterns. The opening may include a static electricity blocking part to block external static electricity as some of the metal patterns are disconnected.

The display device may include a unit alignment mark including a grouping at least two of the alignment marks as one bundle. The window may include a display part corresponding to the display region of the substrate and a non-display part corresponding to the non-display region of the substrate, and each of the alignment marks may overlap with the non-display part of the window. The display panel may include a plurality of alignment marks on the substrate and corresponding to the non-display region of the substrate.

BRIEF DESCRIPTION OF THE DRAWINGS

Features will become apparent to those of skill in the art by describing in detail exemplary embodiments with reference to the attached drawings in which:

FIGS. 8A to 8D illustrate additional embodiments of an alignment;

DETAILED DESCRIPTION

Figure 1:
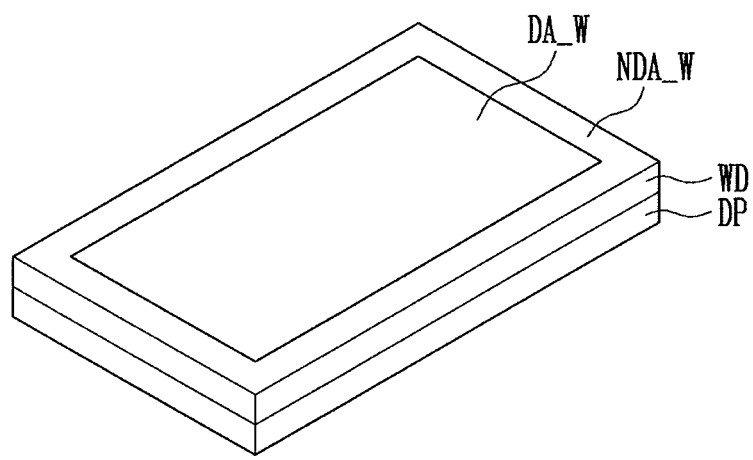
FIG. 1 illustrates an embodiment of a display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Figure 2:
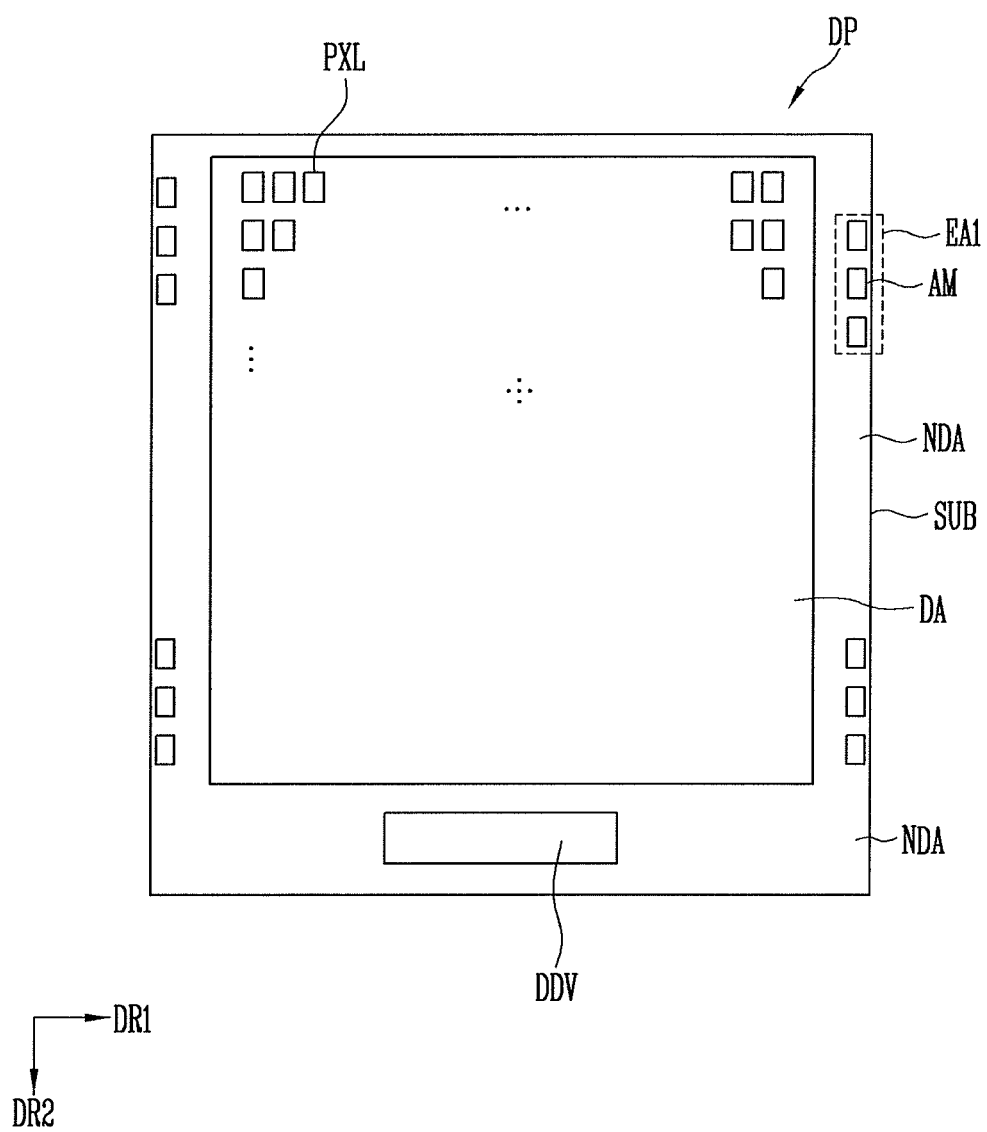
FIG. 2 illustrates an embodiment of a display panel.

FIG. 1 illustrates an embodiment of a display device, and FIG. 2 illustrates an embodiment of a display panel, which, for example, may be included in the display device of FIG. 1. Referring to FIGS. 1 and 2, the display device may have various shapes. For example, the display device may have a quadrangular plate shape with two pairs of sides parallel to each other. When the display device has a rectangular plate shape, one pair of sides may be longer than the other pair of sides. In an embodiment, a case where the display device has a pair of long sides and a pair of short sides is illustrated for convenience of description. The short sides extend in a first direction DR1 and the long sides extend in a second direction DR2.

The display device may include a display panel DP and a window WD. The display panel DP may display arbitrary visual information, e.g., a text, a video, a picture, a two-dimensional or three-dimensional image, etc. The display panel DP may be an organic light emitting display panel (OLED panel) or another type of panel.

The display panel DP may have various shapes, e.g., a closed polygon with linear sides, a circle, an ellipse, or another curved shape with curved sides, or a semicircle or a semi-ellipse with linear and curved sides. In an embodiment, the display panel DP may have a shape corresponding to that of the display device.

The display panel DP may include a substrate SUB including a display region DA and a non-display region NDA. The substrate SUB may be made of an insulative material such as glass or resin. Also, the substrate SUB may be made of a material having flexibility (which allows the substrate SUM to be bendable or foldable) in a single- or multi-layered structure.

Examples of flexible materials include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate, which may or may not be combined. In one embodiment, the substrate SUB may be made of a fiber reinforced plastic (FRP) or another material.

The display region DA is located at a central portion of the display panel DP, and may have an area larger than the non-display region NDA. The display region DA may have various shapes, e.g., a closed polygon with linear sides, a circle, an ellipse, or another curved shape with curved sides, or a semicircle or a semi-ellipse with linear and curved sides.

When the display region DA includes a plurality of regions, each region may also have various shapes, e.g., a closed polygon with linear sides, a circle, an ellipse, or another curved shape with curved sides, or a semicircle or a semi-ellipse with linear and curved sides. The plurality of regions may have areas equal to or different from one another. In an embodiment, a case where the display region DA is provided as one region having a quadrangular shape including linear sides is described as an example.

The non-display region NDA may be at at least one side of the display region DA. In an embodiment, the non-display region NDA may surround the circumference of the display region DA. In an embodiment, the non-display region NDA may include a lateral part extending along the first directional DR1 and a longitudinal part extending along the second directional DR2. The longitudinal part of the non-display region NDA may be provided in a pair spaced apart from each other along the width direction of the display region DA.

A plurality of pixels PXL may be in the display region DA. Each pixel PXL may be a minimum unit emitting light for displaying an image. In an embodiment, each pixel PXL may include an organic light emitting display element. Each pixel PXL may emit color light, e.g., red, green, blue, white cyan, magenta, yellow, or another color.

The non-display region NDA may be provided with a driving unit for driving the pixels PXL, a power supply unit for providing a power source to each pixel PXL, and a portion of a line unit for connecting the pixels PXL and the driving unit.

The driving unit provides signals to respective pixels through the line unit, for controlling the driving of the pixels PXL. The driving unit may include, for example, a scan driver for providing a scan signal to each pixel PXL along scan lines, an emission driver for providing an emission control signal to each pixel along emission control lines, a data driver DDV for providing a data signal to each pixel PXL along data lines, and a timing controller. The timing controller may control the scan driver, the emission driver, and the data driver DDV.

The power supply unit may include at least one power line. For example, the power supply unit may include a first power line and a second power line. The power supply unit may supply a power source voltage to the pixels PXL in the display region DA.

A plurality of alignment marks AM may be in the non-display region NDA. The alignment marks AM may be used as identification marks for alignment in a process of combining the display panel DP and the window WD. The alignment marks AM may be used, for example, to define a bezel in a final display device. The alignment marks AM may have various shapes. In an embodiment, the alignment marks AM are at the longitudinal part of the non-display region NDA. In one embodiment, the alignment marks AM may be in the lateral part of the non-display region NDA.

The window WD may be on a display surface of the display panel DP and may have various shapes, e.g., a closed polygon with linear sides, a circle, an ellipse, or another curved shape with curved sides, or a semicircle or a semi-ellipse with linear and curved sides.

In an embodiment, when the window WD has linear sides, at least one portion of corners of each of the shapes may be formed in a curve. For example, when the window WD has a rectangular shape, a portion at which adjacent linear sides meet each other may be replaced with a curve having a predetermined curvature. The curvature may be differently set depending on positions of the curvature. For example, the curvature may be changed depending on the position at which the curve is started, the length of the curve, or another factor. In an embodiment, the window WD may have a shape corresponding to that of the substrate SUB of the display panel DP.

The window WD may be provided as a substrate made of a transparent insulating material. In an embodiment, various materials may be further added to the insulating material to have excellent durability, surface smoothness, and transparency.

The window WD may be an outermost cover member on the top of the display panel DP to protect an exposed surface of the display panel DP. The window WD allows an image from the display panel DP to be transmitted therethrough and simultaneously provides protection against external impact. The window WD, therefore, may prevent the display panel DP from being damaged or erroneously operated due to external impact. The external impact may result, for example, from an external force or stress which causes the display panel DP to have a defect. The entire or a portion of the window WD may be flexible.

The window WD may include a window display region DA_W and a window non-display region NDA_W. The window display region DA_W may correspond to the display region DA of the display panel DP. The window non-display region NDA_W may correspond to the non-display region NDA of the display panel DP. The window display region DA_W is a region through which an image is transmitted from the display panel DP, and may be a region in which an image is displayed in the final display device. The window non-display region NDA_W is a region in which the image is not displayed, and may correspond to the bezel in the final display device.

Figure 3:
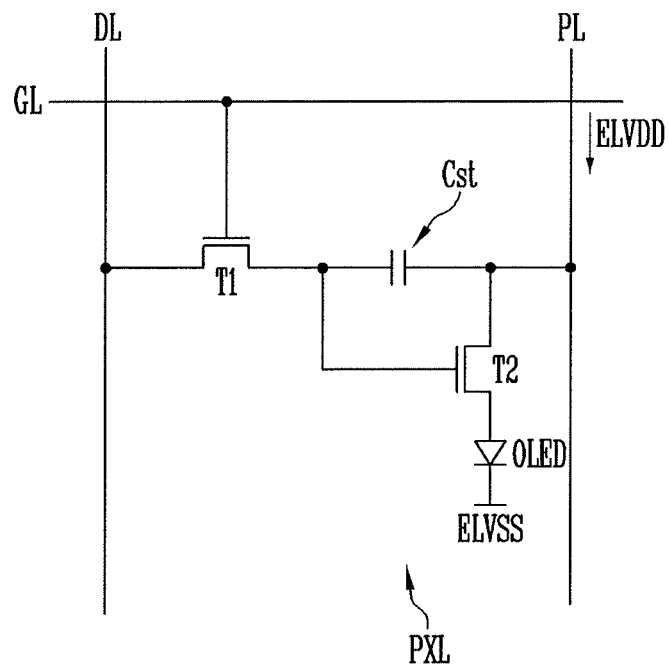
FIG. 3 illustrates an embodiment of a pixel.

FIG. 3 illustrates an embodiment of a pixel, which, for example, may be representative of the pixels PXL of FIG. 2. Referring to FIGS. 2 and 3, each pixel PXL may include at least one transistor connected to lines, a light emitting element OLED connected to the transistor, and a capacitor Cst. The light emitting element OLED may be a top-emission type organic light emitting element or a bottom-emission type organic light emitting element. The organic light emitting element may be an organic light emitting diode.

Each pixel PXL may include a driving circuit for driving the light emitting element OLED. The driving circuit may include, for example, a first transistor (or switching transistor) T1, a second transistor (or driving transistor) T2, and the capacitor Cst. A first power source ELVDD may be to the second transistor T2 through a power line PL. A second power source ELVSS may be provided to the light emitting element OLED. The second power source ELVSS may be set to a voltage lower than that of the first power source ELVDD.

The first transistor t1 outputs a data signal applied to a data line DL based on a scan signal applied to a gate line GL. The capacitor Cst charges a voltage corresponding to the data signal from the first transistor T1. The second transistor T2 is connected to the light emitting element OLED and controls a driving current flowing through the light emitting element OLED, based on the amount of charge stored in the storage capacitor Cst.

In an embodiment, pixel PXL includes two transistors T1 and T2. In one embodiment, pixel PXL may include one transistor and one capacitor, or may include three or more transistors and two or more capacitors. For example, one pixel PXL may include seven transistors, the light emitting element OLED, and the capacitor Cst.

Figure 4:
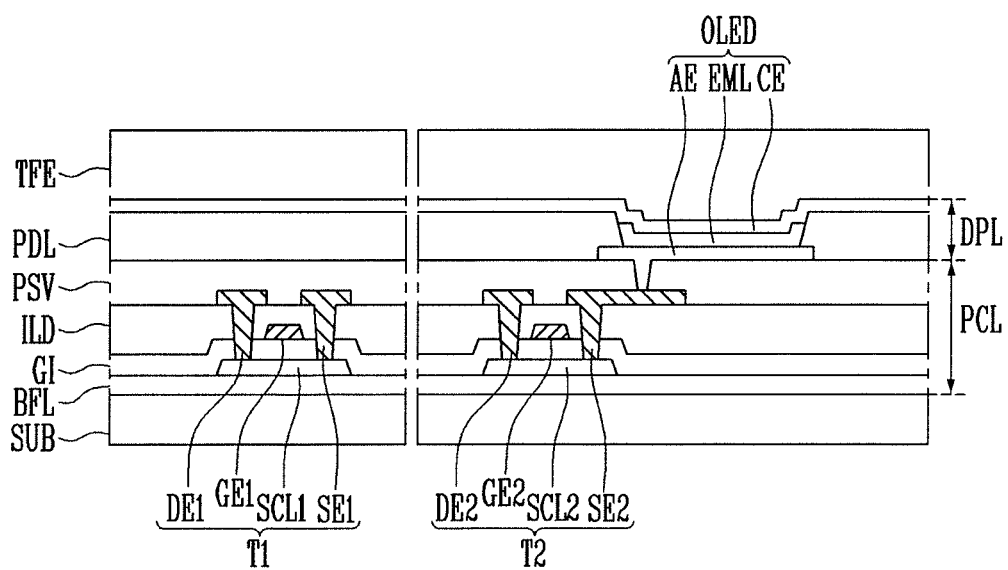
FIG. 4 illustrates a sectional embodiment of the display panel.

FIG. 4 illustrates a sectional view of a portion of the display panel SP of FIG. 2 according to an embodiment. Referring to FIGS. 2 and 4, the display panel DP may include a substrate SUB, a pixel circuit unit PCL, a display element layer DPL, and a thin film encapsulation layer TFE.

The substrate SUB may be made of a material having flexibility to be bendable or foldable, and have a single- or multi-layered structure.

The pixel circuit unit PCL may include a buffer layer BFL on the substrate SUB and first and second transistors T1 and T2 disposed on the buffer layer BFL.

The buffer layer BFL may prevent an impurity from being diffused into the first and second transistors T1 and T2. The buffer layer BFL may be made as a single layer or a multi-layer including at least two layers. When the buffer layer BFL has a multi-layer structure, the layers may be formed of the same or different materials. In one embodiment, the buffer layer BFL may be omitted, for example, according to the material and process conditions of the substrate SUB.

The first transistor T1 may be a switching transistor for switching the second transistor T2. The second transistor T2 may be a driving transistor electrically connected to a light emitting element OLED of the display element layer DPL to drive the light emitting element OLED. The first transistor Ti may include a first semiconductor layer SCL1, a first gate electrode GE1, a first source electrode SE1, and a first drain electrode DE1. The second transistor T2 may include a second semiconductor layer SCL2, a second gate electrode GE2, a second source electrode SE2, and a second drain electrode DE2.

The first and second semiconductor layers SCL1 and SCL2 may be on the buffer layer BFL. The first and second semiconductor layers SCL1 and SCL2 may include source regions and drain regions, which are in contact with the first and second source electrodes SE1 and SE2 and the first and second drain electrodes DE1 and DE2, respectively. A region between the source region and the drain region may be a channel region. Each of the first and second semiconductor layers SCL1 and SCL2 may be a semiconductor pattern made of poly-silicon, amorphous silicon, oxide semiconductor, or another material. The channel region is a semiconductor pattern undoped with an impurity, and may be an intrinsic semiconductor. The source region and the drain region are semiconductor patterns doped with the impurity. The impurity may include impurities such as an n-type impurity, a p-type impurity, and other metals.

The first gate electrode GE1 may be on the first semiconductor layer SCL1 with a gate insulating layer GI interposed therebetween. The second gate electrode GE2 may be on the second semiconductor layer SCL2 with the gate insulating layer GI interposed therebetween.

The first source electrode SE1 and the first drain electrode DE1 may be in contact with the source region and the drain region of the first semiconductor layer SCL1 through contact holes passing through an interlayer insulating layer ILD and the gate insulating layer GI, respectively. The second source electrode SE2 and the second drain electrode DE2 may be in contact with the source region and the drain region of the second semiconductor layer SCL2 through contact holes passing through the interlayer insulating layer ILD and the gate insulating layer GI, respectively.

A protective layer PSV may be over the first and second transistor T1 and T2.

The display element layer DPL may include the light emitting element OLED disposed on the protective layer PSV. The light emitting element OLED may include a first electrode AE, a second electrode CE, and an emitting layer EML between the two electrodes AE and CE. One of the first and second electrodes AE and CE may be an anode electrode, and the other of the first and second electrodes AE and CE may be a cathode electrode. For example, the first electrode AE may be an anode electrode and the second electrode CE may be a cathode electrode. When the light emitting element OLED is a top-emission type organic light emitting element, the first electrode AE may be a reflective electrode and the second electrode CE may be a transmissive electrode. In an embodiment, a case where the light emitting element OLED is a top-emission type organic light emitting element and the first electrode AE is an anode electrode is described as an example.

The first electrode AE may be connected to the second source electrode SE2 of the second transistor T2 through a contact hole passing through the protective layer PSV. The first electrode AE may include a reflective layer for reflecting light and a transparent conductive layer on the top or bottom of the reflective layer. At least one of the transparent conductive layer and the reflective layer may be connected to the second source electrode SE2.

The display element layer DPL may include a pixel defining layer PDL having an opening that allows a portion of the first electrode AE, e.g., a top surface of the first electrode AE to be exposed therethrough. The pixel defining layer PDL may include an organic insulating material.

The emitting layer EML may be on the exposed surface of the first electrode AE.

The emitting layer EML may include a low-molecular or high-molecular material. The emitting layer EML may have a single layer or multi-layer structure including various functions. When the emitting layer EML has a multi-layer structure, the emitting layer EML may have a structure in which a hole injection layer, a hole transport layer, an emission layer, an electron transport layer, an electron injection layer, and the like are stacked in a single or complex structure.

The color of light generated in the emitting layer EML may, for example, red, green, blue, white, magenta, cyan, yellow, or another color.

The second electrode CE may be on the emitting layer EML and may be a semi-transmissive reflective layer. For example, the second electrode CE may be a thin metal layer having a thickness, through which light emitted through the emitting layer EML can be transmitted. The second electrode CE may transmit a portion of the light emitted from the emitting layer EML therethrough, and may reflect the rest of the light emitted from the emitting layer EML.

The thin film encapsulation layer TFE may be over the light emitting element OLED. The thin film encapsulation layer TFE may have a single layer or multi-layer structure. The thin film encapsulation layer TFE may include a plurality of insulating layers covering the light emitting element OLED. For example, the thin film encapsulation layer TFE may include a plurality of inorganic layers and a plurality of organic layers. For example, the thin film encapsulation layer TFE may have a structure in which the inorganic layers and the organic layers are alternately stacked. Also, in some cases, the thin film encapsulation layer TFE may be an encapsulating substrate over the light emitting element OLED and combined with the substrate SUB through a sealant.

Figure 5:
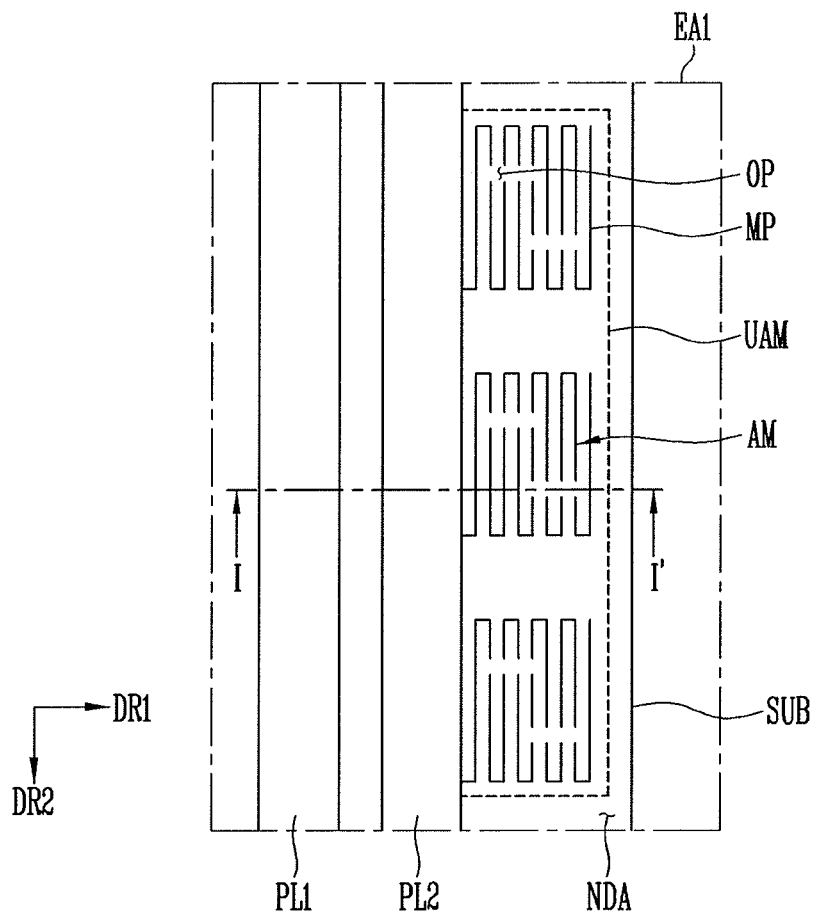
FIG. 5 illustrates an enlarged view of region EA1 of FIG. 2.
Figure 6:
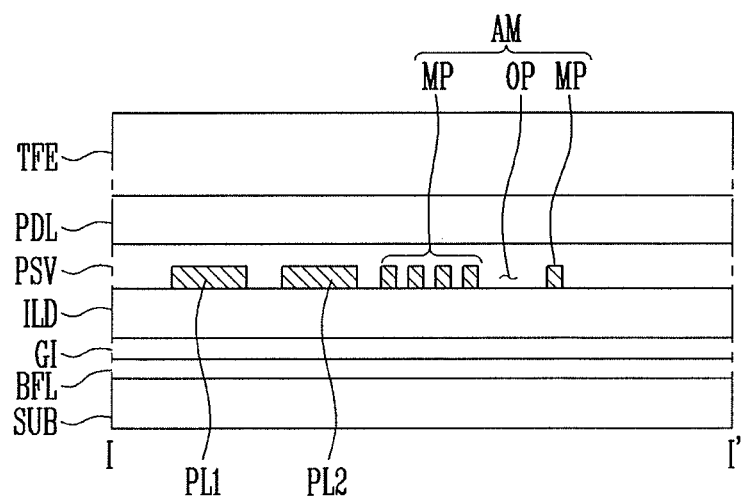
FIG. 6 illustrates sectional view taken along line I-I' in FIG. 5.

FIG. 5 illustrates an enlarged view of region EA1 of FIG. 2. FIG. 6 illustrates a sectional view taken along line I-I' of FIG. 5. For convenience of description, components in the non-display region (e.g., an arrangement relationship between a power line and alignment marks) are mainly illustrated in FIG. 5.

Referring to FIGS. 2, 5, and 6, the display panel DP may include a substrate SUB including a display region DA and a non-display region NDA. A plurality of pixels PXL may be in the display region DA of the substrate SUB. Power lines PL1 and PL2 and a plurality of alignment marks AM may be in the non-display region NDA.

The power lines PL1 and PL2 may extend in a second direction DR2 on the substrate SUB. The power lines PL1 and PL2 may include a first power line PL1 and a second power line PL2 sequentially arranged along a first direction DR1 intersecting the second direction DR2. The first power line PL1 may apply the first power source (e.g., see ELVDD of FIG. 3) to each pixel PXL. The second power line PL2 may apply the second power source (e.g., see ELVSS of FIG. 3) to each pixel PXL.

The first and second power lines PL1 and PL2 may extend along an edge of the display region DA in the non-display region NDA. The first power line PL1 and the second power line PL2 may have the same width. In one embodiment, the first power line PL1 and the second power line PL2 may have widths different from each other. The second power line PL2 is spaced apart from the first power line PL1 at a certain distance, and may be outside of the first power line PL1. In one embodiment, the second power line PL2 may be a line at the outermost side among lines in the non-display region NDA. In one embodiment, the line at the outermost side among the lines in the non-display region NDA may include a ground line, a static electricity blocking line, and/or a crack detection pattern. The alignment marks AM may be identification marks used to perform alignment in a process of combining the display panel DP and the window (e.g., see WD of FIG. 1).

In an embodiment, the alignment marks AM may be at the outside of the second power line PL2 in the non-display region NDA. For example, the alignment marks AM may be between the second power line PL2 and an edge of the non-display region NDA. In one embodiment, the alignment marks AM may be integrally provided in the same layer.

Each of the alignment marks AM may include a plurality of, e.g., i (i is a natural number of 2 or more) metal patterns MP arranged along the direction in which the second power line PL2 extends. For example, in one embodiment, one alignment mark AM may include nine metal patterns MP. A metal pattern MP most adjacent to the second power line PL2 among the nine metal patterns MP may be a first metal pattern MP. A metal pattern MP most adjacent to the edge of the non-display region NDA among the nine metal patterns MP may be a ninth metal pattern MP.

Each of the nine metal patterns MP may be in the non-display region NDA, such that the distance from a metal pattern MP adjacent thereto is about a few microns (μm). This may prevent a vision camera from recognizing the metal patterns MP when the vision camera recognizes the alignment marks AM. For example, spacing the adjacent metal patterns MP from each other by a few μm may prevent the vision camera from recognizing the metal patterns MP individually, but may allow recognition of the entire or overall shape of the metal patterns MP collectively. If the distance between adjacent metal patterns MP is larger than a few the vision camera may recognize each individual metal pattern MP as a power line in the non-display region NDA when the vision camera recognizes the alignment marks AM. In this case, the vision camera may not be able to recognize the alignment marks AM. In order to prevent misrecognition of the vision camera, the metal patterns MP may be designed so the distance between adjacent metal patterns MP is about a few μm.

The metal patterns MP may be integrally provided with the second power line PL2. The metal patterns MP may be made of the same material in the same layer as the second power line PL2. In an embodiment, the first metal pattern MP most adjacent to the second power line PL2 among the metal patterns MP may be connected to the second power line PL2.

The metal patterns MP may be electrically connected to adjacent metal patterns MP and be arranged in a predetermined (e.g., zigzag) pattern when viewed on a plane. For example, one end of the first metal pattern MP may be connected to the second power line PL2, and the other end of the first metal pattern MP may be connected to the other end of a second metal pattern MP adjacent to the first metal pattern MP. Also, one end of the second metal pattern MP may be connected to one end of a third metal pattern MP adjacent to the second metal pattern MP. Also, the other end of the third metal pattern MP may be connected to the other end of a fourth metal pattern adjacent to the third metal pattern MP. In addition, one end of the fourth metal pattern MP may be connected to one end of a fifth metal pattern MP adjacent to the fourth metal pattern MP, the other end of the fifth metal pattern MP may be connected to the other end of a sixth metal pattern MP adjacent to the fifth metal pattern MP, one end of the sixth metal pattern MP may be connected to one end of a seventh metal pattern MP adjacent to the sixth metal pattern MP, the other end of the seventh metal pattern MP may be connected to the other end of an eighth metal pattern MP adjacent to the seventh metal pattern MP, and one end of the eighth metal pattern MP may be connected to one end of the ninth metal pattern MP adjacent to the eighth metal pattern MP.

Each alignment mark AM may further include an opening OP exposing an interlayer insulating layer ILD on the bottom of the metal patterns MP between the metal patterns MP. The opening OP may be a region formed as some of the metal patterns MP are disconnected.

The opening OP may be a static electricity blocking part for blocking the flow path of static electricity that may be introduced from the outside. For example, the opening OP may block static electricity introduced from the outside from flowing in the second power line PL2 through the metal patterns MP. Although static electricity from the outside is introduced into the metal patterns MP, the static electricity is induced into the opening OP between the metal patterns MP. Hence, it is possible to block the static electricity from flowing in the second power line PL2. Thus, the second power line PL2 is not influenced by the static electricity.

As described above, when the each alignment mark AM is integrally provided with the second power line PL2, the area occupied by the alignment mark AM in the non-display region NDA may be reduced, compared with the case where separate alignment marks are in the non-display region NDA. Accordingly, the size of a dead space in the non-display region NDA may be reduced or eliminated, thereby reducing or minimizing the size of the bezel of the finally produced display device.

Further, according to the above-described embodiment, the alignment marks AM and the second power line PL2 may be in the same layer formed using a same process. As a result, the manufacturing process of the display device may simplified, compared with the case where alignment marks are formed through a separate process.

Also, when the resolution of the vision camera is low, the vision camera may recognize each alignment mark AM having the above-described structure as a simple shape. When only one alignment mark AM is provided in the non-display region NDA, the vision camera may recognize the alignment mark AM as a line in the non-display region NDA.

In order to prevent this, in accordance with one embodiment, a unit alignment mark UAM may be obtained by grouping three alignment marks AM, sequentially arranged along the second direction DR2, as one bundle. As the unit alignment mark UAM is registered to an algorithm of the vision camera, the vision camera may detect whether the display panel DP is aligned with the window WD by recognizing the unit alignment mark UAM. In an embodiment, the unit alignment mark UAM may be obtained by grouping three alignment marks AM adjacent to each other as one bundle. The unit alignment mark UAM may be obtained by grouping a different number (e.g., at least two or more than three alignment marks AM adjacent to each other) as one bundle.

The distance between one alignment mark AM in the unit alignment mark UAM and an alignment mark adjacent thereto may be, for example, about 100 μm to about 200 μm. This distance may be different in another embodiment.

FIG. 6 illustrates an embodiment of the display panel DP including the alignment marks AM. Referring to FIG. 6, a buffer layer BFL may be disposed on the substrate SUB. A gate insulating layer GI and the interlayer insulating layer ILD may be disposed on the buffer layer BFL. The first power line PL1, the second power line PL2, and the metal patterns MP may be on the interlayer insulating layer ILD. The opening OP may be between the metal patterns MP.

In an embodiment, the first power line PL1, the second power line PL2, and the metal patterns MP may be made of a single metal, but may be made of two or more kinds of metals or an alloy of two or more kinds of metals in other embodiments. For example, the first power line PL1, the second power line PL2, and the metal patterns MP may be formed in a single-layered structure of molybdenum (Mo), tungsten (W), molybdenum tungsten (MoW), aluminum neodymium (AlNd), titanium (Ti), aluminum (Al), silver (Ag) and any allow thereof, or any mixture thereof. In other embodiments, the first power line PL1, the second power line PL2, and the metal patterns MP may be formed in a double- or multi-layered structure of predetermined metals (e.g., Mo, Al, and/or Ag), which may be a low-resistance material, in order to reduce line resistance.

A protective layer PSV may be on the interlayer insulating layer ILD on which the first and second power lines PL1 and PL2 and the metal patterns MP are provided. A pixel defining layer PDL may be on the protective layer PSV. A thin film encapsulation layer TFE may be on the pixel defining layer PDL.

FIGS. 7A to 7D illustrate various embodiments of the alignment mark of FIG. 5, and correspond to enlarged views of region EA1 of FIG. 2. Referring to FIGS. 2, 7A, 7B, 7C, and 7D, the first power line PL1, the second power line PL2, and alignment marks AM may be in the non-display region NDA of the substrate SUB.

Each alignment mark AM may include a plurality of metal patterns MP that extend in the extending direction of the second power line PL2 and, for example, may have the same length. The metal patterns MP are not electrically connected to the second power line PL2, and may be between the second power line PL2 and an edge of the non-display region NDA when viewed on a plane. The metal patterns MP may be spaced apart from the second power line PL2 at a predetermined distance. For example, the metal patterns MP may be in a state in which they are electrically isolated from the second power line PL2. Thus, when static electricity is introduced into the metal patterns MP from the outside, the static electricity does not flow in the second power line PL2.

Figure 7A:
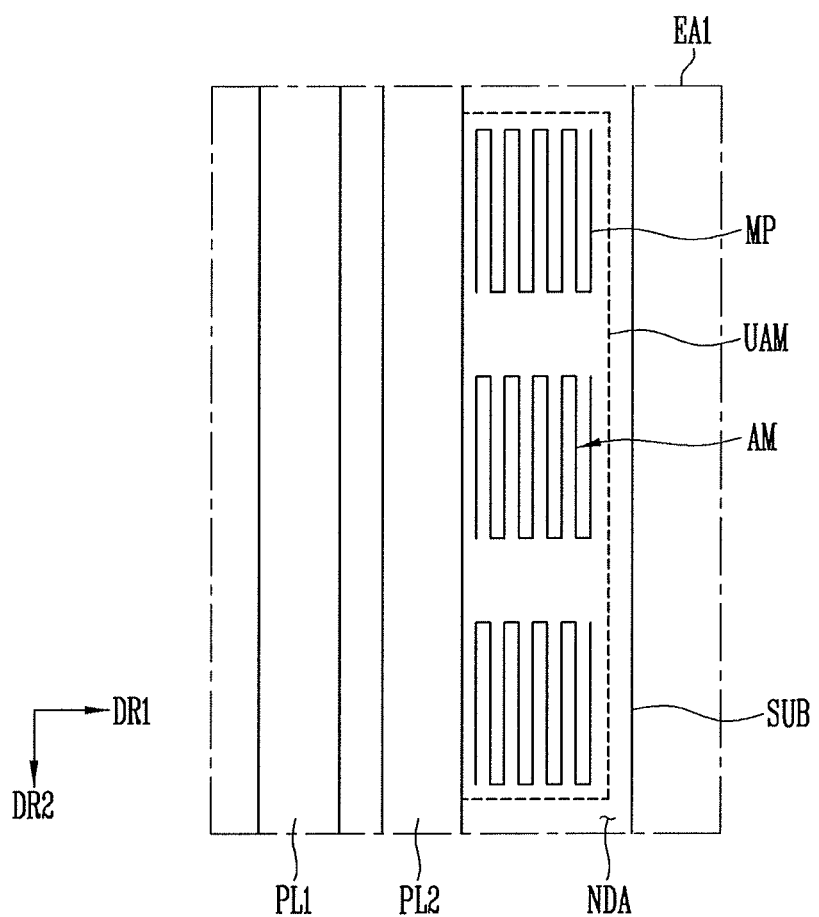
FIGS. 7A to 7D illustrate various embodiments of an alignment mark.
Figure 7B:
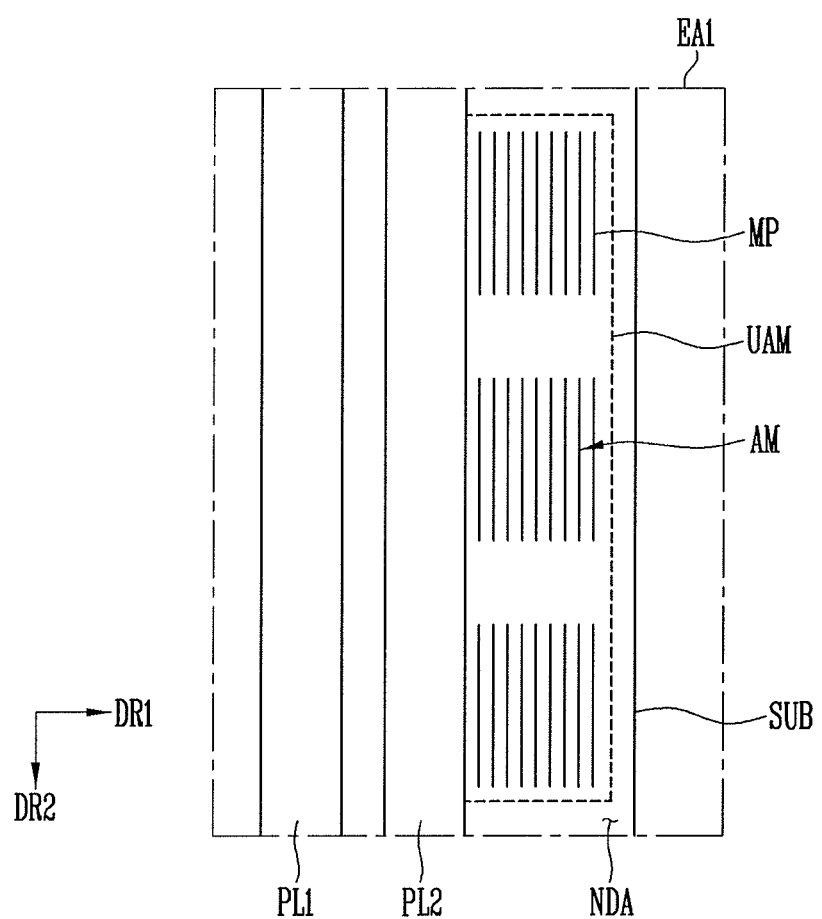

The metal patterns MP may be electrically connected to adjacent metal patterns MP, as shown in FIG. 7A. In one embodiment, the metal patterns MP may not be electrically connected to adjacent metal patterns MP, as shown in FIG. 7B.

Figure 7C:
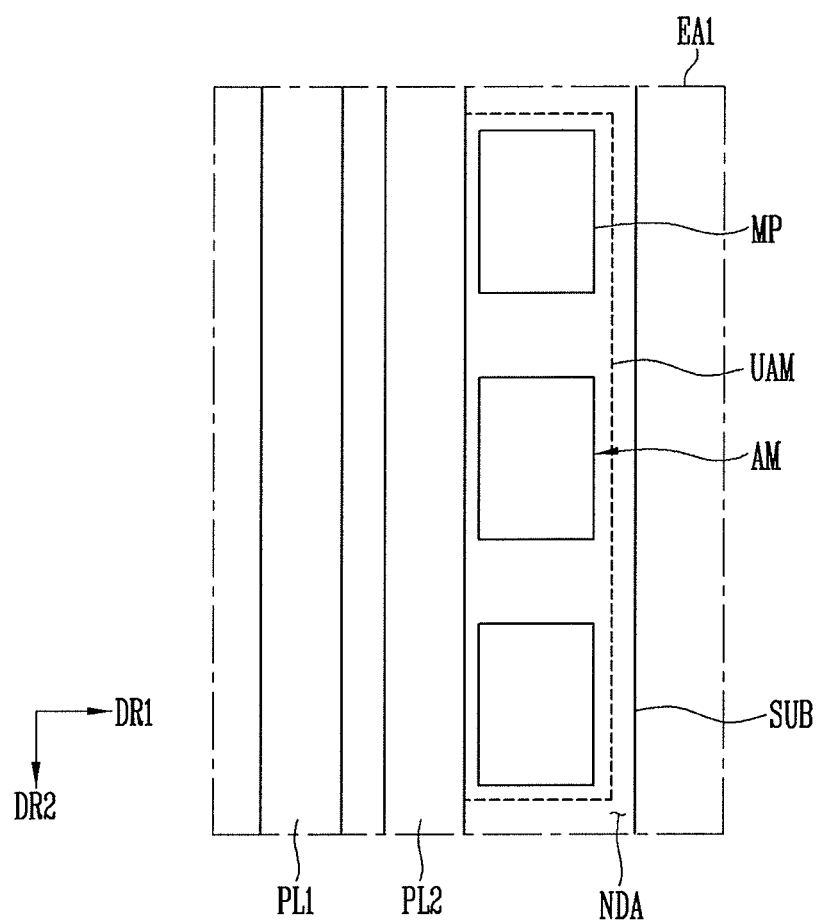
Figure 7D:
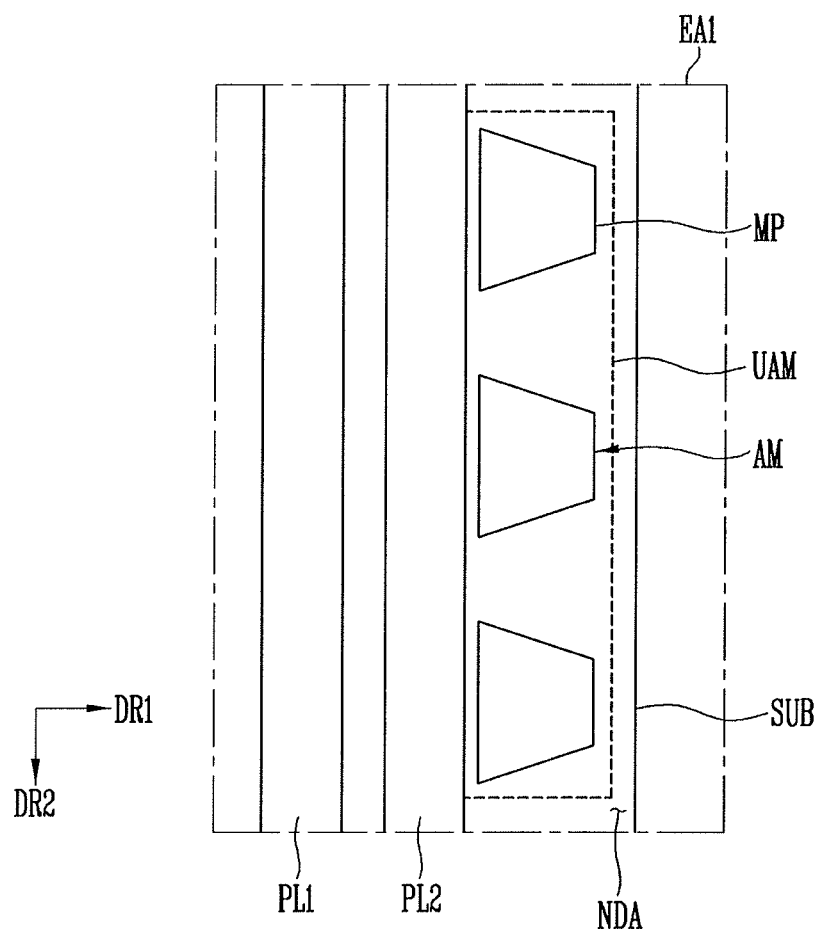

In some embodiments, each alignment mark AM may be configured with one metal pattern having a predetermined (e.g., quadrangular) shape, as shown in FIG. 7C. In one embodiment, each alignment mark AM may be configured with one metal pattern MP having a different predetermined (e.g., trapezoidal shape), as shown in FIG. 7D.

In an embodiment, each alignment mark AM may have various shapes within a range where a vision camera may recognize the alignment mark AM. Since the resolution of the vision camera is low, the vision camera may recognize the metal patterns MP as one metal pattern MP having a predetermined (e.g., quadrangular) shape, as shown in FIG. 7C, and this is the case even though each alignment mark AM includes the metal patterns MP as shown, for example, in FIGS. 7A and 7B.

FIGS. 8A to 8D illustrate additional embodiments of the alignment mark of FIG. 5, which figures are enlarged views of the region EA1 of FIG. 2. Referring to FIGS. 2, 8A, 8B, 8C, and 8D, the first power line PL1, the second power line PL2, and alignment marks AM may be in the non-display region NDA of the substrate SUB.

Each alignment mark AM may include a plurality (e.g., nine) metal patterns MP extending in the extending direction of the second power line PL2. The nine metal patterns MP may have extension lengths different from one another. For example, the extension lengths of the nine metal patterns MP may become shorter as the nine metal patterns MP become more distant from the second power line PL2. Therefore, a first metal pattern MP most adjacent to the second power line PL2 among the nine metal patterns MP may have the longest length, and a ninth metal pattern MP most distant from the second power line PL2 among the nine metal patterns MP may have the shortest length.

Figure 8A:
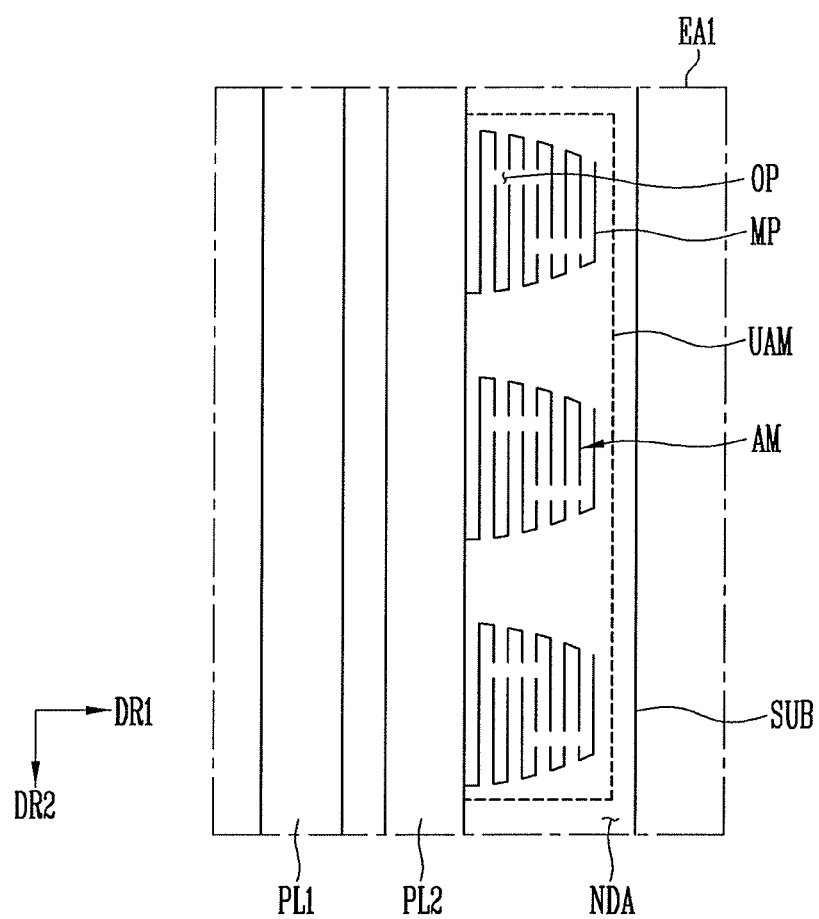

As shown in FIG. 8A, each alignment mark AM may include an opening OP between the nine metal patterns MP. The opening OP may be a region formed as some of the nine metal patterns MP are disconnected. At this time, the first metal pattern MP may be electrically connected to the second power line PL2.

Figure 8B:
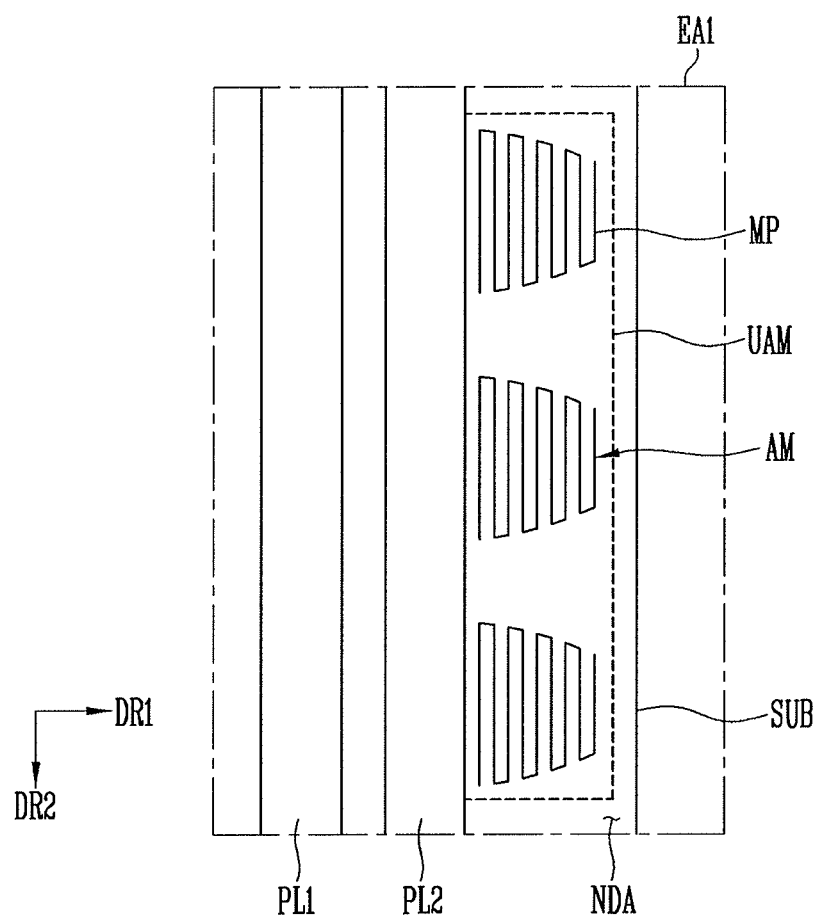

In some embodiments, as shown in FIGS. 8B and 8C, the first metal pattern MP may not be electrically connected to the second power line PL2. In this case, the nine metal patterns MP may be electrically isolated from the second power line PL2.

Figure 8D:
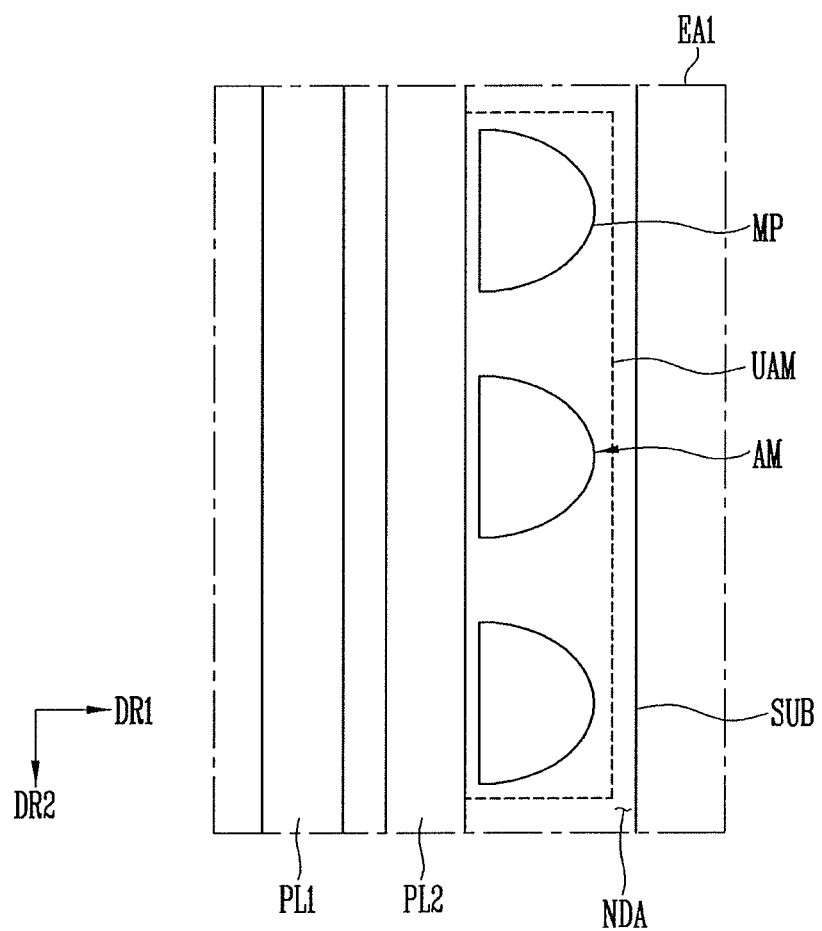

As shown in FIGS. 8A and 8B, the nine metal patterns MP may be electrically connected to adjacent metal patterns MP. In one embodiment, as shown in FIG. 8C, the nine metal patterns MP may not be electrically connected to adjacent metal pattern MP. In some embodiments, as shown in FIG. 8D, each alignment mark AM may be configured with one metal pattern MP having a predetermined (e.g., semicircular) shape.

Figure 9:
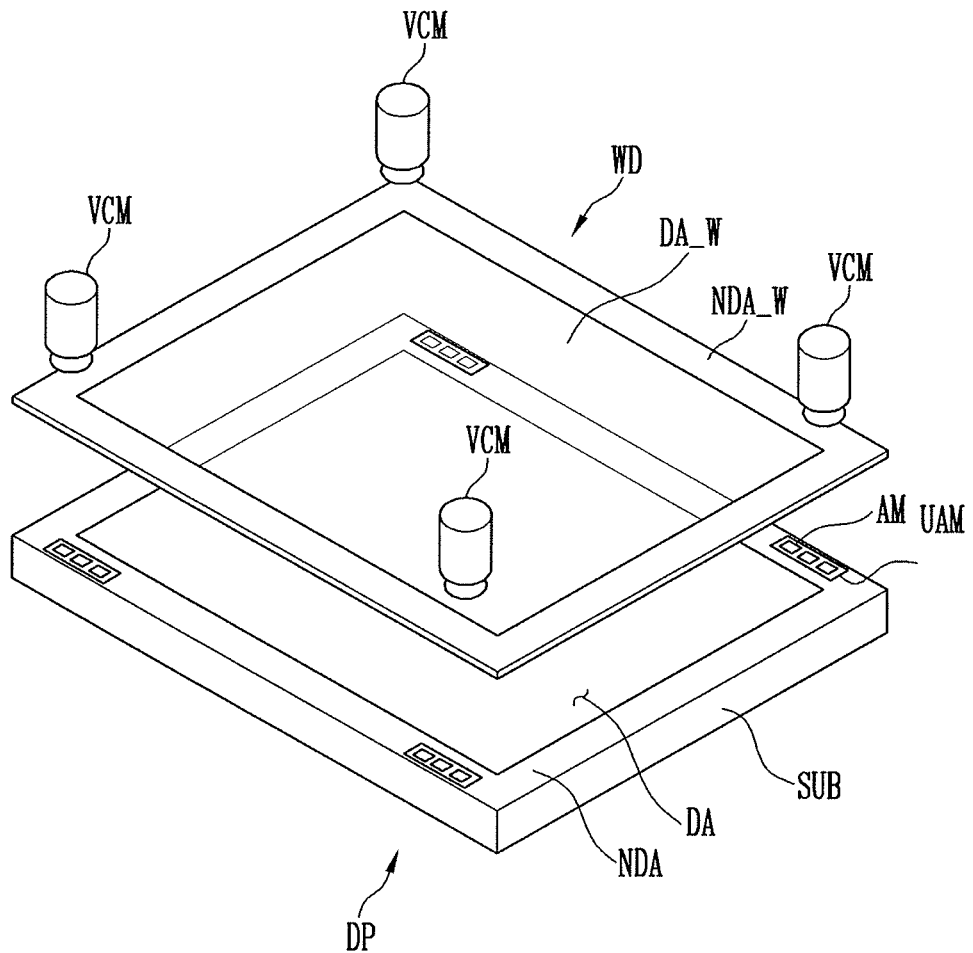
FIG. 9 illustrates an embodiment where the display panel and window are aligned.

FIG. 9 illustrates an example of a state in which the display panel and the window of FIG. 1 are aligned. Referring to FIG. 9, a vision camera VCM may be above the window WD, e.g., the vision camera VCM may be above the window WD to correspond to the window non-display region NDA_W.

The vision camera VCM may determine whether the window WD and the display panel DP are aligned with each other, by determining whether the window non-display region NDA_W corresponds to an alignment mark AM of the display panel DP on the bottom of the window WD. When it is determined by the vision camera VCM that the alignment mark AM is aligned in the window non-display region NDA_W, the window WD may be vertically dropped toward the display panel DP and be combined with the display panel DP.

According to the above-described embodiment, the display device may be employed together with a touch sensor that is one of input devices and may be used in various electronic devices.

Figure 10:
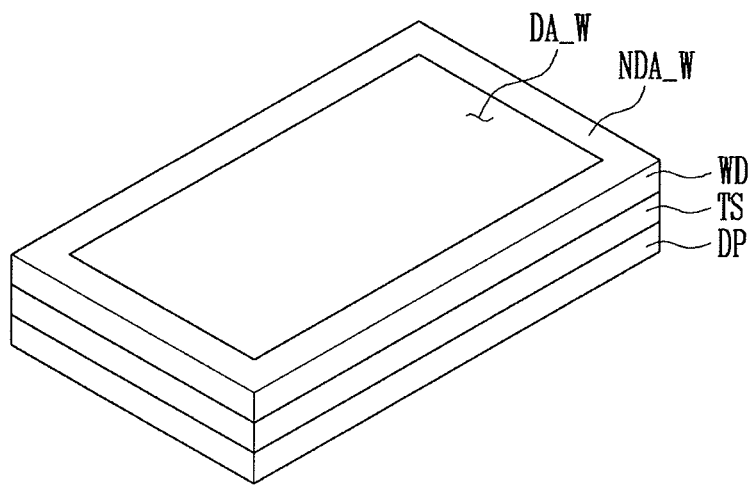
FIG. 10 illustrates an embodiment which includes a touch sensor.
Figure 11:
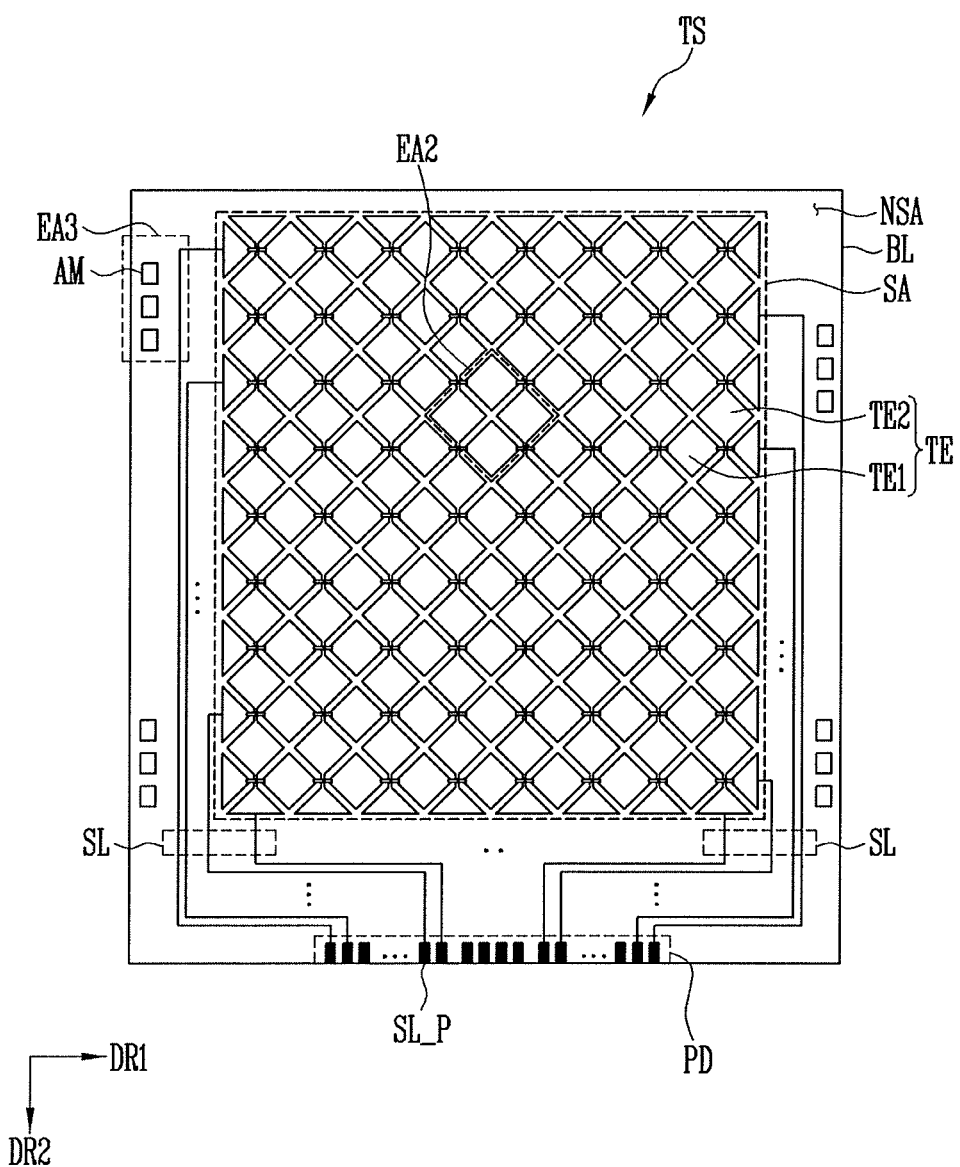
FIG. 11 illustrates another embodiment which includes a touch sensor.
Figure 12:
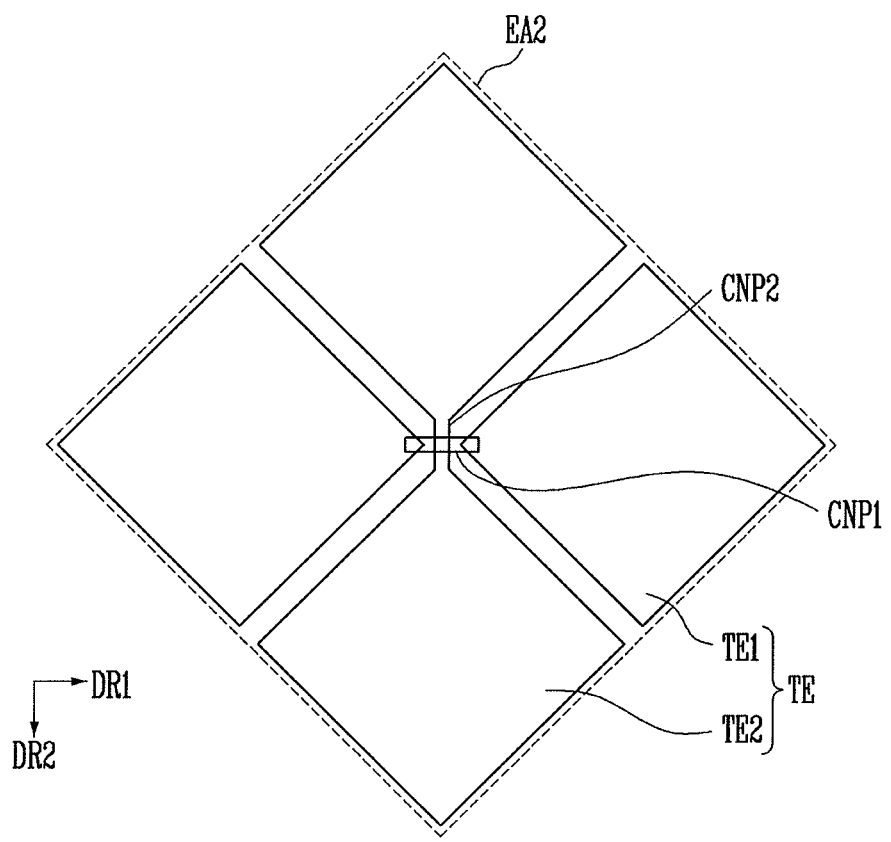
FIG. 12 illustrates an enlarged view of region EA2 of FIG. 11.

FIG. 10 illustrates an embodiment in which a touch sensor is employed in the display device of FIG. 1. FIG. 11 illustrates an embodiment of the touch sensor of FIG. 10. FIG. 12 illustrates an example of an enlarged view of region EA2 of FIG. 11.

Referring to FIGS. 1 and 10-12, the display device may have various shapes. For example, the display device may have a quadrangular plate shape having two pairs of sides parallel to each other. When the display device is provided in a rectangular plate shape, any one pair of sides among the two pairs of sides may be provided longer than the other pair of sides.

The display device may include a display panel DP, a touch sensor TS, and a window WD. The display panel DP may display an image. The display panel DP may include a display region (e.g., see DA of FIG. 2) and a non-display region (e.g., see NDA of FIG. 2).

The window WD may be on an exposed surface of the touch sensor TS, in order to allow the image from the display panel DP to be transmitted therethrough and simultaneously protect the touch sensor TS. The window WD may include a window display region DA_W and a window non-display region NDA_W.

The touch sensor TS may be on at least one of both surfaces of the display panel DP. For example, the touch sensor TS may be on a surface of the display panel DP in the direction in which an image is emitted to receive a touch input of a user. Also, the touch sensor TS may be integrally formed with the display panel DP. In an embodiment, a case where the touch sensor TS is on a top surface of the display panel DP is described as an example.

The touch sensor TS may recognize a touch event from the display device through a finger of a user or a separate input means, e.g., stylus. In an embodiment, the touch sensor TS may be driven using a mutual capacitance method or a self-capacitance method.

The touch sensor TS may include a base layer including a sensing region SA and a non-sensing region NSA. The sensing region SA may correspond to the display region DA of the display panel DP, and the non-sensing region NSA may correspond to the non-display region NDA of the display panel DP. In addition, the sensing region SA may correspond to the window display region DA_W, and the non-sensing region NSA may correspond to the window non-display region NDA_W.

A plurality of touch electrodes TE may be in the sensing region SA, and sensing lines SL, a pad unit PD, and a plurality of alignment marks AM may be in the non-sensing region NSA.

Some of the touch electrodes TE may be arranged in a first direction DR1 and may be electrically connected to each other, to constitute a plurality of touch electrode rows parallel to each other. The touch electrodes TE in the touch electrode rows may be first touch electrodes TE1. On the touch electrode rows, adjacent first touch electrodes TE1 may be electrically connected to each other through a first connection pattern CNP1.

Other ones of the touch electrodes TE may be arranged in a second direction DR2 and may be electrically connected to each other, to constitute a plurality of touch electrode columns parallel to each other. The touch electrodes TE in the touch electrode columns may be second touch electrodes TE2. On the touch electrode columns, adjacent second touch electrodes TE2 may be electrically connected to each other through a second connection pattern CNP2. Each of the touch electrode rows and the touch electrode columns may be electrically connected to a sensing pad SL_P in the pad unit PD through the sensing line SL.

The sensing lines SL may electrically connect the touch electrodes TE and an external driving circuit. The sensing lines SL may transfer a sensing input signal from the driving circuit to the touch electrodes TE, or may transfer a sensing output signal from the touch electrodes TE to the driving circuit.

The alignment marks AM may be serve as identification marks for alignment in a process of combining the display panel DP and the window WD. For example, the alignment marks AM may be used to define a bezel in a final display device. In an embodiment, each alignment mark AM may be integrally provided with an outermost sensing line SL at the outermost side among the sensing lines SL in the non-sensing region NSA.

Figure 13:
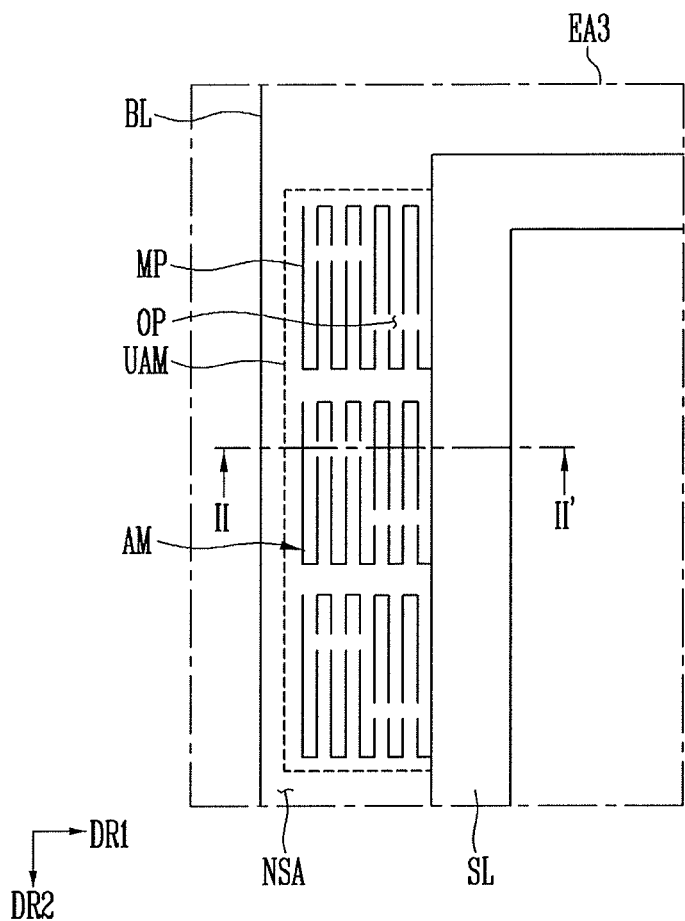
FIG. 13 illustrates an enlarged view of region EA3 of FIG. 11.
Figure 14:
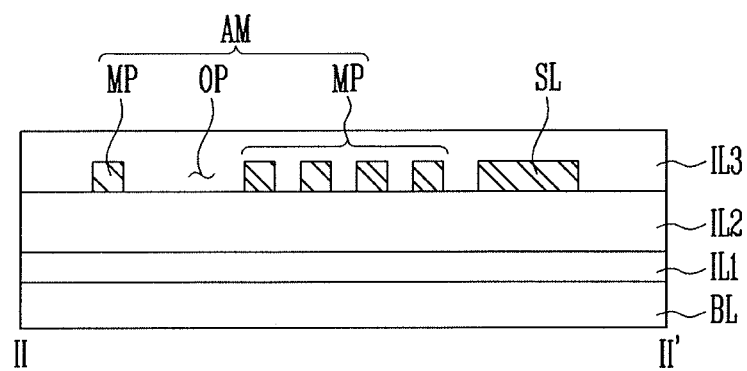
FIG. 14 illustrates a sectional view taken along line II-II' in FIG. 13.

FIG. 13 illustrates an example of an enlarged view of region EA3 of FIG. 11. FIG. 14 illustrates a sectional view taken along line II-II' of FIG. 13.

Referring to FIGS. 11, 13, and 14, the touch sensor TS may include a base layer BL, a first insulating layer IL1 on the base layer BL, a second insulating layer IL2 on the first insulating layer IL1, a plurality of metal patterns MP and a plurality of sensing lines SL, which are on the second insulating layer IL2, and a third insulating layer IL3 over the sensing lines SL.

The base layer BL may include a sensing region SA and a non-sensing region NSA. The first insulating layer IL1 may be on the base layer BL. The first insulating layer IL1 may include at least one of an organic insulating material and an inorganic insulating material. When the first insulating layer IL1 includes the inorganic insulating material, the first insulating layer IL1 may include, for example, at least one of silicon oxide, silicon nitride, and silicon oxynitride.

A plurality of touch electrode TE may be in the sensing region SA of the base layer BL. A plurality of sensing lines SL and a plurality of alignment marks AM may be in the non-sensing region NSA of the base layer BL.

Some of the touch electrodes TE may be on the first insulating layer IL1. For example, a first connection pattern (e.g., see CNP1 of FIG. 12) in the touch electrodes TE may be on the first insulating layer IL1.

The second insulating layer IL2 may be on the first insulating layer IL1 on which the first connection pattern CNP1 is provided. The second insulating layer IL2 may include the same material as the first insulating layer IL1, but may include a different material in another embodiment.

A first touch electrode (e.g., see TE1 of FIG. 12), a second touch electrode (e.g., see TE2 of FIG. 12), and a second connection pattern (e.g., see CNP2 of FIG. 12) among the touch electrodes TE may be on the second insulating layer IL2.

The sensing lines SL may extend in the second direction DR2 on the base layer BL, and may be bent toward the sensing region SA to be connected to the touch electrodes TE. The sensing lines SL may be on the second insulating layer IL2. The sensing lines SL may be in the same layer as some components of the touch electrodes TE, e.g., the first touch electrode TE1, the second touch electrode TE2, and the second connection pattern CNP2.

The third insulating layer IL3 may be over the sensing lines SL, the first touch electrode TE1, the second touch electrode TE2, and the second connection pattern CNP2. The third insulating layer IL3 may prevent the sensing lines SL, the first touch electrode TE1, the second touch electrode TE2, and the second connection pattern CNP2 from being exposed to the outside, and may prevent the sensing lines SL, the first touch electrode TE1, the second touch electrode TE2, and the second connection pattern CNP2 from being corroded. The third insulating layer IL3 may include an organic insulating material. For example, the third insulating layer IL3 may include one of acryl, polyimide (PI), polyamide (PA), and benzocyclobutene (BCB). Since the third insulating layer IL3 is transparent and flexible, the third insulating layer IL3 may reduce and planarize winding of a lower structure. The alignment marks AM may serve as identification marks to perform alignment in a process of combining the touch sensor TS and the window (e.g., see WD of FIG. 10).

In an embodiment, the alignment marks AM may be outside of the outermost sensing line SL at the outermost side among the sensing lines SL in the non-sensing region NSA. For example, the alignment marks AM may be between the outermost sensing line SL and an edge of the non-sensing region NSA. The alignment marks AM is integrally provided with the outermost sensing line SL and may be provided in the same layer as the outermost sensing line SL.

Each alignment mark AM may include the plurality of metal patterns MP. The metal patterns MP may include i (i is a natural number of 2 or more) metal patterns MP arranged along the direction in which the outermost sensing line SL extends. For example, one alignment mark AM may include nine metal patterns MP. A metal pattern MP most adjacent to the outermost sensing line SL among the nine metal patterns MP may be a first metal pattern MP, and a metal pattern most adjacent to the edge of the non-sensing region NSA among the nine metal patterns MP may be a ninth metal pattern MP.

The metal patterns MP may be integrally provided with the outermost sensing line SL. Also, the metal patterns MP may be provided in the same layer as the outermost sensing line SL and, for example, be made of the same material as the outermost sensing line SL. In an embodiment, the first metal pattern MP most adjacent to the outermost sensing line SL among the metal patterns MP may be connected to the outermost sensing line SL. The metal patterns MP are electrically connected to adjacent metal patterns MP and may be arranged in a predetermined (e.g., zigzag) pattern when viewed on a plane.

Each alignment mark AM may further include an opening OP that exposes the second insulating layer IL2 on the bottom of the metal patterns MP between the metal patterns MP. The opening OP may be a region formed as some of the metal patterns MP are disconnected.

The opening OP may be a static electricity blocking part for blocking the flow path of static electricity that may be introduced from the outside. For example, the opening OP may block static electricity introduced from the outside from flowing in the outermost sensing line SL through the metal patterns MP. Even though static electricity from the outside is introduced into the metal patterns MP, the static electricity is induced into the opening OP between the metal patterns MP. Thus, the outermost sensing line SL is not influenced by the static electricity.

If each alignment mark AM is integrally provided with the outermost sensing line SL, the area occupied by the alignment marks AM in the non-sensing region NSA may be reduced, as compared with the case in which separate alignment marks are inserted in the non-sensing region NSA. Accordingly, the size of a dead space in the non-sensing region NSA may be reduced. As a result, the size of the bezel of the final display device may be reduced or minimized.

In an embodiment, a unit alignment mark UAM may be obtained by grouping a plurality of (e.g., three) alignment marks AM, sequentially arranged along the second direction DR2, as one bundle. This may prevent misrecognition of a vision camera (e.g., see VCM of FIG. 9) having a low resolution. The vision camera VCM may detect whether the display panel DP is aligned with the window WD by recognizing the unit alignment mark UAM.

The display device may be employed in various electronic devices, including but not limited to televisions, notebook computers, cellular phones, smart phones, smart pads, PMPs, PDAs, navigations, various wearable devices such as smart watches, and the like.

In accordance with one or more embodiments, it may therefore be possible to provide a display device with reduced or minimized a dead space.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
a substrate including a display region and a non-display region;
a plurality of pixels in the display region, each of the plurality of pixels including at least one transistor and a light emitting element connected to the transistor;
a plurality of power lines, in the non-display region of the substrate, to apply a power source voltage to each of the pixels;
a window including a display part corresponding to the display region of the substrate and a non-display part corresponding to the non-display region of the substrate, the window being combined with the substrate; and
a plurality of alignment marks on the substrate and corresponding to the non-display region, the alignment marks integrally provided with an outermost power line at an outermost side of the non-display region among the power lines, wherein each of the alignment marks overlaps with the non-display part of the window.

2. The display device as claimed in claim 1, wherein an outermost power line and the alignment marks are in a same layer and include a same material.

3. The display device as claimed in claim 2, wherein:
each of the alignment marks includes a plurality of metal patterns extending along an extending direction of the outermost power line, and
the metal patterns are at the outside of the outermost power line in the non-display region.

4. The display device as claimed in claim 3, wherein:
each of the alignment marks includes an opening between the metal patterns, and
the opening is a static electricity blocking region that blocks external static electricity as one or more of the metal patterns are disconnected.

5. The display device as claimed in claim 3, wherein the metal patterns are connected to adjacent metal patterns and have a zigzag form when viewed on a plane.

6. The display device as claimed in claim 3, wherein the metal patterns are not electrically connected to adjacent metal patterns.

7. The display device as claimed in claim 3, further comprising:
a unit alignment mark including a grouping at least two of the alignment marks as one bundle.

8. The display device as claimed in claim 1, wherein each alignment mark is in the non-display region of the substrate to correspond to the non-display part of the window.

9. The display device as claimed in claim 1, wherein the alignment marks are spaced apart from adjacent alignment marks by a certain distance.

10. The display device as claimed in claim 1, wherein the power lines may include:
- a first power line to provide a first power source voltage to each pixel; and
- a second power line to provide a second power source voltage to each pixel,
- wherein the second power line is at the outside of the first power line and is the outermost power line.

11. A display device, comprising:
- a display panel including a substrate including a display region and a non-display region, and a plurality of pixels in the display region;
- a touch sensor, on the display panel, to sense a touch of a user; and
- a window on the touch sensor, wherein the touch sensor includes:
- a base layer including a sensing region to sense the touch and a non-sensing region at one side of the sensing region;
- a plurality of touch electrodes in the sensing region;
- a plurality of sensing lines in the non-sensing region and electrically connected to the plurality of touch electrodes; and
- a plurality of alignment marks on the base layer and corresponding to the non-sensing region, the alignment marks integrally provided with an outermost sensing line at an outermost side of the non-sensing region among the sensing lines.

12. The display device as claimed in claim 11, wherein the outermost sensing line and the alignment marks are in a same layer and include a same material.

13. The display device as claimed in claim 12, wherein:
- each of the alignment marks includes a plurality of metal patterns extending along an extending direction of the outermost sensing line, and
- the metal patterns are at the outside of the outermost sensing line in the non-sensing region.

14. The display device as claimed in claim 13, wherein each of the alignment marks includes an opening between the metal patterns.

15. The display device as claimed in claim 14, wherein the opening includes a static electricity blocking part to block external static electricity as some of the metal patterns are disconnected.

16. The display device as claimed in claim 13, further comprising:
- a unit alignment mark including a grouping at least two of the alignment marks as one bundle.

17. The display device as claimed in claim 11, wherein:
- the window includes a display part corresponding to the display region of the substrate and a non-display part corresponding to the non-display region of the substrate, and
- each of the alignment marks overlaps with the non-display part of the window.

18. The display device as claimed in claim 11, wherein the display panel includes a plurality of alignment marks on the substrate and corresponding to the non-display region of the substrate.

* * * * *